United States Patent
Tsai et al.

[11] Patent Number: 5,981,398
[45] Date of Patent: Nov. 9, 1999

[54] HARD MASK METHOD FOR FORMING CHLORINE CONTAINING PLASMA ETCHED LAYER

[75] Inventors: Chia-Shiung Tsai, Hsin-Chu; Chao-Cheng Chen, Tainan County; Hun-Jan Tao, Hsin-Chu, all of Taiwan

[73] Assignee: Taiwan Semiconductor Manufacturing Company, Ltd., Hsin-Chu, Taiwan

[21] Appl. No.: 09/058,122

[22] Filed: Apr. 10, 1998

[51] Int. Cl.$^6$ .............................. H01L 21/3065
[52] U.S. Cl. ................ 438/710; 438/742; 438/743; 438/781; 438/782
[58] Field of Search ................... 438/710, 720, 438/723, 742, 743, 781, 782

[56] References Cited

U.S. PATENT DOCUMENTS

| | | | |
|---|---|---|---|
| 5,219,788 | 6/1993 | Abernathey et al. | 438/636 |
| 5,540,812 | 7/1996 | Kadomura | 438/710 |
| 5,582,679 | 12/1996 | Lianjun et al. | 438/669 |
| 5,602,060 | 2/1997 | Kobayashi et al. | 438/781 |
| 5,656,128 | 8/1997 | Hashimoto et al. | 216/47 |
| 5,665,641 | 9/1997 | Shen et al. | 438/643 |
| 5,750,316 | 5/1998 | Kawamura et al. | 430/311 |
| 5,830,332 | 11/1998 | Babich et al. | 204/192.15 |
| 5,883,011 | 3/1999 | Lin et al. | 438/747 |

Primary Examiner—William Powell
Assistant Examiner—Donald L. Champagne
Attorney, Agent, or Firm—George O. Saile; Stephen B. Ackerman; Alek P. Szecsy

[57] ABSTRACT

A method for forming a chlorine containing plasma etched patterned layer. There is first provided a substrate 10 employed within a microelectronics fabrication. There is then formed over the substrate a blanket target layer 12 formed of a material susceptible to etching within a second plasma employing a chlorine containing etchant gas composition. There is then formed upon the blanket target a blanket hard mask layer 14 formed of a material selected from the group consisting of silsesquioxane spin-on-glass (SOG) materials and amorphous carbon materials. There is then formed upon the blanket hard mask layer a patterned photoresist layer 16. There is then etched while employing the patterned photoresist layer as a first etch mask layer and while employing a first plasma employing a fluorine containing etchant gas composition the blanket hard mask layer to form a patterned hard mask layer. Finally, there is then etched while employing at least the patterned hard mask layer as a second etch mask layer and while employing the second plasma employing the chlorine containing etchant gas composition the blanket target layer to form the patterned target layer.

12 Claims, 1 Drawing Sheet

HARD MASK METHOD FOR FORMING CHLORINE CONTAINING PLASMA ETCHED LAYER

BACKGROUND OF THE INVENTION

1. Field of the Invention

The present invention relates generally methods for forming chlorine containing plasma etched patterned layers within microelectronics fabrications. More particularly, the present invention relates to hard masking methods for forming chlorine containing plasma etched patterned layers within microelectronics fabrications.

2. Description of the Related Art

Microelectronics fabrications are formed from microelectronics substrates over which are formed patterned microelectronics conductor layers which are separated by microelectronics dielectric layers.

As microelectronics fabrication integration levels have increased and microelectronics fabrication device and patterned conductor layer linewidth dimensions have decreased, it has become increasingly challenging to form within microelectronics fabrications chlorine containing plasma etched patterned layers, such as but not limited to chlorine containing plasma etched patterned conductor layers (including but not limited to patterned metal conductor layers, patterned metal alloy conductor layers and patterned metal silicide conductor layers) and chlorine containing plasma etched patterned silicon layers (including but not limited to patterned amorphous silicon layers, patterned monocrystalline silicon layers and patterned polycrystalline silicon layers), with a uniform and attenuated linewidth. The challenge of forming chlorine containing plasma etched patterned layers with uniform and attenuated linewidth within advanced microelectronics fabrications typically derives from: (1) a reduced depth of focus with which an advanced photoexposure apparatus may photoexpose a blanket photoresist layer to form within a microelectronics fabrication a patterned photoresist etch mask layer of attenuated linewidth, thus limiting the thickness of the patterned photoresist etch mask layer of attenuated linewidth so formed; and (2) a corrosive and/or erosive effect of a chlorine containing etch plasma upon the patterned photoresist etch mask layer, when the patterned photoresist etch mask layer is employed for defining a chlorine containing plasma etched patterned layer from a chlorine containing plasma etchable blanket layer formed beneath the patterned photoresist etch mask layer, while employing the chlorine containing etch plasma.

It is thus towards the goal of forming within microelectronics fabrications from chlorine containing plasma etchable blanket layers chlorine containing plasma etched patterned layers of uniform and attenuated linewidth while employing chlorine containing plasma etch methods which in turn employ patterned photoresist etch mask layers of attenuated linewidth and attenuated thickness that the present invention is directed.

Various chlorine containing plasma etch methods have been disclosed in the art of microelectronics fabrication for forming from chlorine containing plasma etchable blanket layers chlorine containing plasma etched patterned layers within microelectronics fabrications.

For example, Abernathey et al., in U.S. Pat. No. 5,219,788, discloses a chlorine containing plasma etch method for forming from a chlorine containing plasma etchable blanket aluminum containing conductor layer within an integrated circuit microelectronics fabrication a chlorine containing plasma etched patterned aluminum containing conductor layer within the microelectronics fabrication, while attenuating webbing of lower portions of a patterned photoresist etch mask layer employed when forming the chlorine containing plasma etched patterned aluminum containing conductor layer. The method employs a blanket silicon containing layer, such as a blanket silicon layer, a blanket silicon dioxide layer or a blanket silsesquioxane spin-on-glass (SOG) derived layer, formed interposed between: (1) a blanket metal nitride layer formed as an anti-reflective coating (ARC) layer upon the blanket aluminum containing conductor layer; and (2) a blanket photoresist layer from which is formed the patterned photoresist etch mask layer, where the blanket photoresist layer has incorporated therein a photoinitiator which generates acid groups which in absence of the blanket silicon containing layer would interact with the blanket metal nitride layer and thus promote webbing of the patterned photoresist etch mask layer.

In addition, Kadomura, in U.S. Pat. No. 5,540,812 discloses a plasma etch method for forming a within an integrated circuit microelectronics fabrication from a chlorine containing plasma etchable blanket aluminum containing conductor layer having a blanket barrier layer formed thereunder a chlorine containing plasma etched patterned aluminum containing conductor layer co-extensive with a patterned barrier layer formed thereunder, while attenuating corrosion of the chlorine containing plasma etched patterned aluminum containing conductor layer. The method comprises three aspects, including: (1) the use of a disulfurdifluoride etchant gas when etching the blanket barrier layer to form the patterned barrier layer; (2) the use of a silicon oxide hard mask in conjunction with a disulfar-dichioride etchant gas when etching the chlorine containing plasma etchable blanket aluminum containing conductor layer to form the chlorine containing plasma etched patterned aluminum containing conductor layer; and (3) the use of a neutral argon beam processing of the silicon oxide hard mask to form a reduction resistant silicon oxide hard mask layer. The reduction resistant silicon oxide hard mask may be employed with an attenuated thickness in comparison with a non-reduction resistant silicon oxide hard mask layer in the presence of reducing agents, such as boron trichloride, which are typically employed within chlorine containing plasma etchant gas compositions when forming chlorine containing plasma etched patterned aluminum containing conductor layers.

Further, Lianjun et al., in U.S. Pat. No. 5,582,679, discloses a chlorine containing plasma etch method for forming within an integrated circuit microelectronics fabrication from a chlorine containing plasma etchable blanket aluminum containing conductor layer a chlorine containing plasma etched patterned aluminum containing conductor layer with an attenuated taper and an attenuated undercutting. The method employs a chlorine containing plasma etchant gas composition comprising boron trichloride, chlorine and nitrogen, where the nitrogen component is believed to lead to a sidewall polymer formed upon the chlorine containing plasma etched patterned aluminum containing conductor layer, thus providing the attenuated taper and the attenuated undercutting of the chlorine containing plasma etched patterned aluminum containing conductor layer.

Finally, Shen et al., in U.S. Pat. No. 5,665,641, discloses a chlorine containing plasma etch method employing a hard mask layer for forming within an integrated circuit microelectronics fabrication from a chlorine containing plasma etchable blanket aluminum containing conductor layer a chlorine containing plasma etched patterned aluminum containing conductor layer with attenuated stress related defects. Within the method, the hard mask layer is formed at a temperature within a range of about 100 degrees centigrade below a sputtering temperature employed for forming the chlorine containing plasma etchable blanket aluminum containing conductor layer.

The teachings of each of the foregoing references are incorporated herein fully by reference.

Desirable in the art of microelectronics fabrication are additional chlorine containing plasma etch methods which may be employed for forming from chlorine containing plasma etchable blanket layers within microelectronics fabrications chlorine containing plasma etched patterned layers of uniform and attenuated linewidth while employing patterned photoresist etch mask layers of attenuated linewidth and attenuated thickness. It is towards that object that the present invention is directed.

SUMMARY OF THE INVENTION

A first object of the present invention is to provide a chlorine containing plasma etch method for forming within a microelectronics fabrication a chlorine containing plasma etched patterned layer from a chlorine containing plasma etchable blanket layer.

A second object of the present invention is to provide a method in accord with the first object of the present invention, where the chlorine containing plasma etched patterned layer is formed with uniform and attenuated linewidth while employing a patterned photoresist etch mask layer of attenuated linewidth and attenuated thickness.

A third object of the present invention is to provide a method in accord with the first object of the present invention or the second object of the present invention, where the microelectronics fabrication is a semiconductor integrated circuit microelectronics fabrication.

A fourth object of the present invention is to provide a method in accord with the first object of the present invention, the second object of the present invention or the third object of the present invention, which method is readily commercially implemented.

In accord with the objects of the present invention, there is provided by the present invention a chlorine containing plasma etch method for forming a chlorine containing plasma etched patterned layer within a microelectronics fabrication. To practice the method of the present invention, there is first provided a substrate employed within a microelectronics fabrication. There is then formed over the substrate a blanket target layer formed of a material susceptible to etching within a second plasma employing a chlorine containing etchant gas composition. There is then formed upon the blanket target layer a blanket hard mask layer formed of a material selected from the group of materials consisting of silsesquioxane spin-onglass (SOG) materials and amorphous carbon materials. There is then formed upon the blanket hard mask layer a patterned photoresist layer. There is then etched while employing the patterned photoresist layer as a first etch mask layer and while employing a first plasma employing a fluorine containing etchant gas composition the blanket hard mask layer to form a patterned hard mask layer. Finally, there is then etched while employing at least the patterned hard mask layer as a second etch mask layer and while employing the second plasma employing the chlorine containing etchant gas composition the blanket target layer to form a patterned target layer.

The present invention provides a method for forming a chlorine containing plasma etched patterned layer within a microelectronics fabrication, where the chlorine containing plasma etched patterned layer is formed of uniform and attenuated linewidth from a chlorine containing plasma etchable blanket layer, while employing a patterned photoresist layer of attenuated linewidth and attenuated thickness. The method of the present invention realizes the foregoing objects by employing when forming the chlorine containing plasma etched patterned layer a patterned hard mask layer formed employing a material selected from the group consisting of silsesquioxane spin-on-glass (SOG) materials and amorphous carbon materials.

The present invention may be employed where the microelectronics fabrication is a semiconductor integrated circuit microelectronics fabrication. The present invention does not discriminate with respect to the nature of a microelectronics fabrication within which there is formed a chlorine containing plasma etched patterned layer while employing the method of the present invention. Thus, the method of the present invention may be employed when forming chlorine containing plasma etched patterned layers within microelectronics fabrications including but not limited to semiconductor integrated circuit microelectronics fabrications, solar cell microelectronics fabrications, ceramic substrate microelectronics fabrications and flat panel display microelectronics fabrications.

The method of the present invention is readily commercially implemented. The method of the present invention provides that a hard mask layer formed from a material selected from the group consisting of silsesquioxane spin-on-glass (SOG) materials and amorphous carbon materials is employed when forming from a chlorine containing plasma etchable blanket layer a chlorine containing plasma etched blanket layer within a microelectronics fabrication. Since methods and materials through which silsesquioxane spin-on-glass (SOG) materials and amorphous carbon materials may be formed into layers within microelectronics fabrications are generally known in the art of microelectronics fabrication, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for forming a chlorine containing plasma etched patterned layer within a microelectronics fabrication, where the chlorine containing plasma etched patterned layer is formed with a uniform and attenuated linewidth while employing a patterned photoresist layer having an attenuated linewidth and an attenuated thickness. The method of the present invention realizes the foregoing object by employing within the method of the present invention a patterned hard mask layer formed of a material selected from the group consisting of silsesquioxane spin-on-glass (SOG) materials and amorphous carbon materials.

The method of the present invention may be employed for forming chlorine containing plasma etched patterned layers from chlorine containing plasma etchable blanket layers within microelectronics fabrications including but not limited to semiconductor integrated circuit microelectronics fabrications, solar cell microelectronics fabrications, ceramic substrate microelectronics fabrications and flat panel display microelectronics fabrications.

Figure 1:
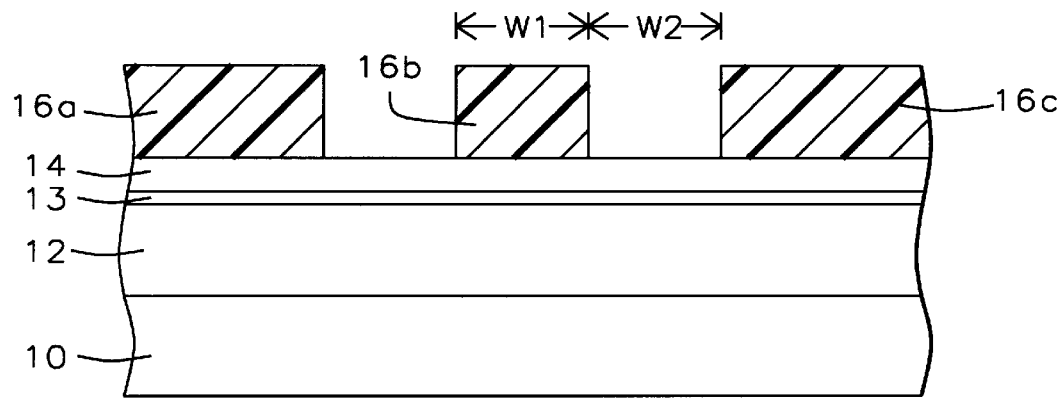
FIG. 1 to FIG. 3 show a series of schematic cross-sectional diagrams illustrating the results of forming in accord with the preferred embodiments of the present invention a chlorine containing plasma etched patterned layer within a microelectronics fabrication in accord with the method of the present invention.
Figure 2:
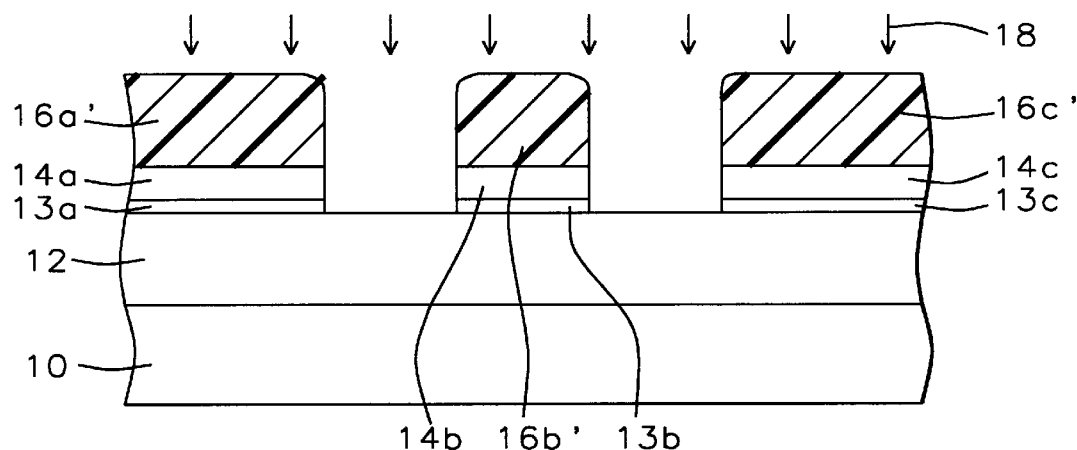
Figure 3:
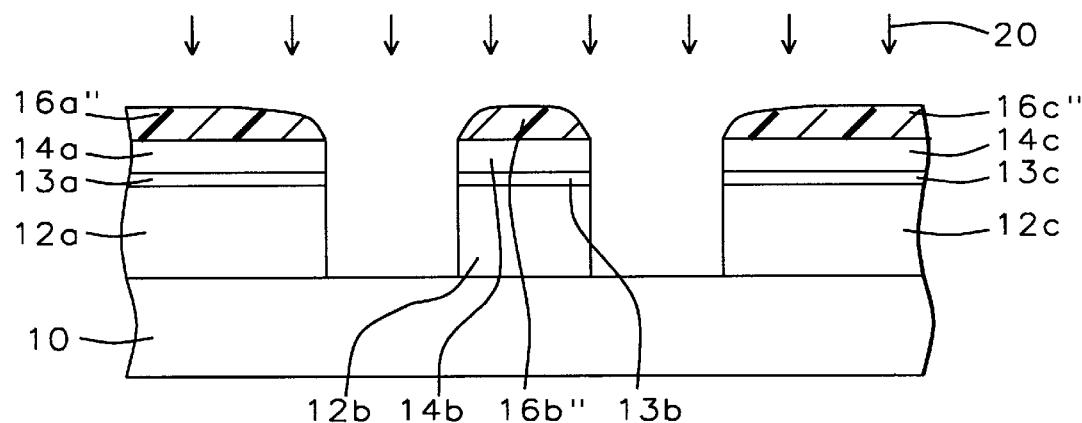

Referring now to FIG. 1 to FIG. 3, there is shown a series of schematic cross-sectional diagrams illustrating the results of progressive stages in forming within a microelectronics fabrication in accord with the preferred embodiments of the present invention a chlorine containing plasma etched patterned layer from a chlorine containing plasma etchable blanket layer. Shown in FIG. 1 is a schematic cross-sectional diagram illustrating the microelectronics fabrication at an early stage in its fabrication in accord with the method of the present invention.

Shown in FIG. 1 is a substrate 10 employed within a microelectronics fabrication, where the substrate 10 has formed thereupon a blanket target layer 12. In turn, the blanket target layer 12 has formed thereupon a blanket silicon oxide dielectric layer 13 which in turn has formed thereupon a blanket hard mask layer 14. Finally, the blanket hard mask layer 14 has formed thereupon a series of patterned photoresist layers 16a, 16b and 16c.

Within the preferred embodiment of the present invention, the substrate 10 is a substrate employed within a microelectronics fabrication selected from the group including but not limited to semiconductor integrated circuit microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be the substrate itself employed within the microelectronics fabrication, or in the alternative, the substrate 10 may be the substrate employed within the microelectronics fabrication, where the substrate has formed thereupon or thereover additional microelectronics layers as are conventional within the microelectronics fabrication within which is employed the substrate 10. Such additional microelectronics layers may include, but are not limited to, microelectronics conductor layers, microelectronics semiconductor layers and microelectronics dielectric layers.

Similarly, as is also not specifically illustrated within the schematic cross-sectional diagram of FIG. 1, the substrate 10, particularly but not exclusively when the substrate 10 incorporates a semiconductor substrate employed within a semiconductor integrated circuit microelectronics fabrication as is more preferred within the preferred embodiments of the present invention, will typically have formed therein and/or thereupon integrated circuit devices, such as but not limited to transistors, resistors, capacitors and diodes, to provide for forming integrated circuits within the semiconductor integrated circuit microelectronics fabrication. Such a semiconductor substrate having integrated circuit devices formed therein and/or thereupon and additional integrated circuit microelectronics fabrication layers formed thereupon and/or thereover represents the most preferred embodiment of the substrate 10 employed within the preferred embodiments of the present invention, although the integrated circuit devices and the additional integrated circuit microelectronics fabrication layers are omitted from the schematic cross-sectional diagram of FIG. 1 in order to provide clarity when describing the preferred embodiments of the present invention. In addition, the most preferred embodiment of the substrate 10 as employed within a semiconductor integrated circuit microelectronics fabrication within the preferred embodiments of the present invention will typically and preferably have a dielectric layer formed upon its upper surface.

With respect to the blanket target layer 12, within the preferred embodiments of the present invention the blanket target layer 12 is formed of a material which is susceptible to etching within a chlorine containing plasma. Such chlorine containing plasmas may employ chlorine containing etchant gas compositions comprising chlorine containing etchant gases including but not limited to chlorine, boron trichloride and hydrogen chloride. Materials which are susceptible to etching within such chlorine containing plasmas include but are not limited to certain metals, metal alloys and metal silicides, as well as polysilicon and several polycides (polysilicon/metal silicide stacks). The blanket target layer 12 may be formed of any of the foregoing materials, employing methods as known in the art of microelectronics fabrication, such methods including but not limited to thermally assisted evaporation methods, electron beam assisted evaporation methods, chemical vapor deposition (CVD) methods and physical vapor deposition (PVD) sputtering methods. More preferably, within the preferred embodiment of the present invention the blanket target layer 12 is formed of an aluminum containing conductor material, such as aluminum or an aluminum alloy, beneath and/or above which is formed a barrier material layer. Preferably, the blanket target layer 12 is formed to a thickness of from about 5000 to about 9000 angstroms.

With respect to the blanket silicon oxide layer 13, the blanket silicon oxide layer 13 is optional within the method of the present invention. When present, however, the blanket silicon oxide layer 13 may be formed employing methods and materials as are conventional in the art of microelectronics fabrication, including but not limited to chemical vapor deposition (CVD) methods, plasma enhanced chemical vapor deposition (PECVD) methods and physical vapor deposition (PVD) sputtering methods. The blanket silicon oxide layer 13, when present, serves as an anti-reflective coating (ARC) layer or a buffer layer within the microelectronics fabrication whose schematic cross-sectional diagram is illustrated in FIG. 1. Preferably, the blanket silicon oxide layer 13 is formed to a thickness of from about 300 to about 1000 angstroms.

With respect to the blanket hard mask layer 14, within the preferred embodiments of the present invention, the blanket hard mask layer 14 is formed from a material selected from the group consisting of silsesquioxane spin-on-glass (SOG) materials and amorphous carbon materials. Silsesquioxane spin-on-glass (SOG) materials are alkoxysilanes characterized by the general formula $(R1)_x Si(OR2)_{(4-x)}$, where: (1) x equals 1 or 2; (2) R1 typically includes at least one radical selected from the group including but not limited to hydrogen radical, carbon bonded hydrocarbon radical and carbon bonded fluorocarbon radical, but not an oxygen bonded radical; and (3) OR2 is an oxygen bonded alkoxide radical, typically but not exclusively methoxide radical or ethoxide radical. Within the preferred embodiments of the present invention, preferred silsesquioxane spin-on-glass (SOG) materials include trialkoxysilanes ($H$—$Si(OR2)_3$), methyltrialkoxysilanes ($CH_3$—$Si(OR2)_3$) and trifluoromethyltrialkoxysilanes ($CF_3$—$Si(OR2)_3$). Within the preferred embodiments of the present invention, amorphous carbon materials may include, but are not limited to, amorphous carbon and fluorinated amorphous carbon.

Within the preferred embodiments of the present invention, the blanket hard mask layer 14 when formed of a silsesquioxane spin-on-glass (SOG) material is formed employing spincoating and thermal curing methods as are conventional in the art of microelectronics fabrication. Such methods typically employ thermal curing at a temperature of from about 250 to about 400 degrees centigrade to fully condense the alkoxide functionality of the silsesquioxane spin-on-glass (SOG) material, while leaving the silicon-hydrogen or silicon-carbon bond intact.

Similarly, within the preferred embodiments of the present invention, the blanket hard mask layer 14 when formed of an amorphous carbon material is formed employing chemical vapor deposition (CVD) or physical vapor deposition (PVD) sputtering methods as are similarly conventional in the art of microelectronics fabrication for forming amorphous carbon material layers within microelectronics fabrications. Such deposition methods similarly may employ carbon source materials or targets as are similarly conventional in the art of microelectronics fabrication. Preferably, the blanket hard mask layer 14 when formed of an amorphous carbon material or a fluorinated amorphous carbon material is formed employing a high density plasma chemical vapor deposition (HDP-CVD) method.

Preferably, the blanket hard mask layer 14, when formed of either a silsesquioxane spin-on-glass (SOG) material or an amorphous carbon material, is formed to a thickness of from about 2000 to about 4000 angstroms over or upon the blanket target layer 12.

As is understood by a person skilled in the art, a patterned hard mask layer formed from the blanket hard mask layer 14 of the present invention when formed employing either a silsesquioxane spin-on-glass (SOG) material or an amorphous carbon material provides advantages in comparison with a patterned hard mask layer formed employing a silicon oxide material as is otherwise conventionally employed for forming hard mask layers within microelectronics fabrications. With respect to patterned hard mask layers formed employing silsesquioxane spin-on-glass (SOG) materials, it is understood by a person skilled in the art that such patterned hard mask layers are, in comparison with patterned hard mask layers formed employing fully oxidized silicon oxide materials as are conventionally employed when forming patterned hard mask layers, inherently less susceptible to reduction with reducing agents, such as boron trichloride, employed when forming chlorine containing plasma etched patterned layers from chlorine containing plasma etchable blanket layers within microelectronics fabrications. Since silsesquioxane spin-on-glass (SOG) material derived patterned hard mask layers are less susceptible to reduction, they need not necessarily be formed as thick as corresponding patterned silicon oxide hard mask layers, particularly patterned silicon oxide hard mask layers formed employing hydrated silicate (silicic acid) spin-on-glass (SOG) materials.

Similarly, with respect to patterned hard mask layers formed employing amorphous carbon materials, such patterned hard mask layers provide an advantage that they may be stripped from a microelectronics fabrication simultaneously with a patterned photoresist layer employed in defining the patterned hard mask layer, when stripping both the patterned photoresist layer and the patterned hard mask layer employing an oxygen containing stripping plasma as is conventional in the art of microelectronics fabrication. Patterned hard mask layers formed of conventional silicon oxide materials are not able to be stripped employing oxygen containing plasma stripping methods.

With respect to the series patterned photoresist layers 16a, 16b and 16c, within the preferred embodiments of the present invention the patterned photoresist layers 16a, 16b and 16c may be formed from any of several photoresist materials as are conventional in the art of microelectronics fabrication, including photoresist materials selected from the general groups of photoresist materials including but not limited to positive photoresist materials and negative photoresist materials. Within the preferred embodiment of the present invention, the series of patterned photoresist layers 16a, 16b and 16c is preferably formed employing a deep ultraviolet (DUV) photoexposable photoresist material to form the series patterned photoresist layers 16a, 16b and 16c having a minimum linewidth W1 and/or a minimum aperture width W2 of from about 0.25 to about 1.0 microns, as illustrated within the schematic cross-sectional diagram of FIG. 1. When forming the series of patterned photoresist layers 16a, 16b and 16c of minimum linewidth W1 from about 0.25 to about 1.0 microns and/or minimum aperture width W2 from about 0.25 to about 1.0 microns, the thickness of the patterned photoresist layers 16a, 16b and 16c is typically limited to no greater than about 8000 angstroms, due to depth of focus limitations of an advanced photoexposure apparatus employed when photoexposing a corresponding blanket photoresist layer employed when forming the series of patterned photoresist layers 16a, 16b and 16c.

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the blanket hard mask layer 14 and the blanket silicon oxide layer 13 have been patterned to form the corresponding patterned hard mask layers 14a, 14b and 14c and the corresponding patterned silicon oxide layers 13a, 13b and 13c through use of a first plasma 18 while employing the series of patterned photoresist layers 16a, 16b and 16c as a first etch mask layer. As is similarly illustrated within the schematic cross-sectional diagram of FIG. 2, the patterned photoresist layers upon exposure to the first plasma 18 are slightly etched to form the etched patterned photoresist layers 16a', 16b' and 16c'.

Within the preferred embodiments of the present invention when the blanket hard mask layer is formed employing a silsesquioxane spin-on-glass (SOG) material, the first plasma 18 preferably employs a fluorine containing etchant gas composition comprising: (1) at least one fluorine containing etchant gas selected from the group including but not limited to perfluorocarbons of no greater than three carbon atoms, hydrofluorocarbons of no greater than three carbon atoms, fluorine, hydrogen fluoride, nitrogen trifluoride and sulfur hexafluoride; and (2) an inert sputtering gas such as but not limited to argon. More preferably, the fluorine containing etchant gas composition comprises carbon tetrafluoride, trifluoromethane and argon. Preferably, the first plasma 18 also employs: (1) a reactor chamber pressure of from about 100 to about 150 mtorr; (2) a source radio frequency power of from about 650 to about 1100 watts at a radio frequency of 13.56 MHZ; (3) a substrate 10 temperature of from about zero to about 15 degrees centigrade; (4) a carbon tetrafluoride flow of from about 30 to about 60 standard cubic centimeters per minute (sccm); (5) a trifluoromethane flow rate of from about 30 to about 60 standard cubic centimeters per minute (sccm); and (6) an argon sputtering gas flow of from about 100 to about 200 standard cubic centimeters per minute (sccm), for a time period sufficient to etch completely through the blanket hard mask layer 14 and the blanket silicon oxide layer 13 when forming the corresponding patterned hard mask layers 14a, 14b and 14c and the corresponding patterned silicon oxide layers 13a, 13b and 13c.

Within the preferred embodiments of the present invention when the blanket hard mask layer is formed employing an amorphous carbon material, the first plasma 18 preferably employs a fluorine containing etchant gas composition comprising: (1) a fluorine containing etchant gas selected from the group including but not limited to fluorine, hydrogen fluoride, nitrogen trifluoride and sulfur hexafluoride; and (2) an inert sputtering gas such as but not limited to argon. More preferably, the fluorine containing etchant gas composition comprises a sulfur hexaflouride and argon. Preferably, the first plasma 18 also employs: (1) a reactor chamber pressure of from about 100 to about 150 mtorr; (2) a source radio frequency power of from about 650 to about 1100 watts at a radio frequency of 13.56 MHZ; (3) a bias sputtering power of from about 50 to about 200 watts; (4) a substrate 10 temperature of from about zero to about 15 degrees centigrade; (5) a sulfur hexafluoride flow of from about 30 to about 60 standard cubic centimeters per minute (sccm); and (6) an argon sputtering gas flow of from about 100 to about 200 standard cubic centimeters per minute (sccm), for a time period sufficient to etch completely through the blanket hard mask layer 14 and the blanket silicon oxide layer 13 when forming the corresponding patterned hard mask layers 14a, 14b and 14c and the corresponding patterned silicon oxide layers 13a, 13b and 13c.

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein the blanket target layer 12 has been patterned to form the patterned target layers 12a, 12b and 12c through use of a second plasma 20 while employing at least in part the patterned hard mask layers 14a, 14b and 14c as a second etch mask layer. As is illustrated within the schematic cross-sectional diagram of FIG. 3, the etched patterned photoresist layers 16a', 16b' and 16c' as illustrated in FIG. 2 are upon exposure to the second plasma 20 further etched to form the twice etched patterned photoresist layers 16a", 16b" and 16c".

Within the preferred embodiments of the present invention, the second plasma 20 employs a chlorine containing etchant gas composition preferably comprising: (1) at least one chlorine containing etchant gas selected from the group including but not limited to chlorine, boron trichloride and hydrogen chloride; (2) a hydrofluorocarbon etchant gas of up to about three carbon atoms, such as but not limited to trifluoromethane; and (3) an inert sputtering gas such as but not limited to argon or nitrogen. More preferably, the chlorine containing etchant gas composition comprises chlorine, boron trichloride, trifluoromethane and argon. Preferably, the second plasma 20 also employs: (1) a reactor chamber pressure of from about 6 to about 12 mtorr; (2) a source radio frequency power of from about 900 to about 1200 watts at a radio frequency of 27.2 MHZ; (3) a bias sputtering power of from about 100 to about 200 watts; (4) a substrate 10 temperature of from about 40 to about 70 degrees centigrade; (5) a chlorine flow of from about 40 to about 70 standard cubic centimeters per minute (sccm); (6) a boron trichloride flow of from about 60 to about 90 standard cubic centimeters per minute (sccm); (7) a trifluoromethane flow of from about 3 to about 7 standard cubic centimeters per minute (sccm); and (8) an argon sputtering gas flow of from about 30 to about 50 standard cubic centimeters per minute (sccm), for a time period sufficient to completely etch the blanket target layer when forming the patterned target layers.

As is illustrated within the schematic cross-sectional diagram of FIG. 3, although when etching the blanket target layer 12 to form the patterned target layers 12a, 12b and 12c when employing the second plasma 20 the etched patterned photoresist layers 16a', 16b' and 16c' are further etched to form the twice etched patterned photoresist layers 16a", 16b" and 16c", the patterned target layers 12a, 12b and 12c are formed with uniform and attenuated linewidth (ie: no etch induced damage to their sidewalls or their tops) since the blanket target layer 12 is etched to form the patterned target layers 12a, 12b and 12c while employing the patterned hard mask layers 14a, 14b and 14c at least in part as the second etch mask layer.

As is discussed above, and as is understood by a person skilled in the art, the twice etched patterned photoresist layers 16a", 16b" and 16c", along with the patterned hard mask layers 14a, 14b and 14c when the patterned hard mask layers 14a, 14b and 14c are formed of an amorphous carbon material, may be sequentially stripped from the microelectronics fabrication whose schematic cross-sectional diagram is illustrated in FIG. 3 within an oxygen containing stripping plasma to provide for further processing of the microelectronics fabrication whose schematic cross-sectional diagram is illustrated in FIG. 3.

As is further understood by a person skilled in the art, it is neither desirable, preferably nor feasible in all circumstances within the present invention to strip patterned photoresist layers from microelectronics fabrications formed employing the present invention until after patterned target layers have been formed in accord with the present invention.

EXAMPLES

Upon a first series of semiconductor substrates was formed a series of blanket photoresist layers formed employing an SEH 4102 positive deep ultra-violet (DUV) photoresist material. The series of blanket photoresist layers was formed to a thickness of about 8000 angstroms each.

Upon a second series of semiconductor substrates was formed a series of blanket hard mask layers employing a FOX hydrogen silsesquioxane spin-on-glass (SOG) material available from Dow Chemical Company. The hydrogen silsesquioxane spin-on-glass (SOG) material was coated and cured at a temperature of about 400–450 degrees centigrade for a time period of about 30 minutes to form each blanket hard mask layer of thickness about 2000 angstroms.

A first set of samples from each of the first series of semiconductor substrates and the second series of semiconductor substrates was subjected to a first plasma etch method employing a carbon tetrafluoride, trifluoromethane and argon etchant gas composition in accord with the preferred embodiments of the present invention. The first plasma etch method also employed: (1) a reactor chamber pressure of about 150 mtorr; (2) a source radio frequency power of about 1100 watts at a radio frequency of 13.56 MHZ; (3) a semiconductor substrate temperature of about 15 degrees centigrade; (4) a carbon tetrafluoride flow of about 45 standard cubic centimeters per minute (sccm); (5) a trifluoromethane flow of about 45 standard cubic centimeters per minute (sccm); and (6) an argon sputtering gas flow of about 150 standard cubic centimeters per minute (sccm).

A second set of samples from each of the first series of semiconductor substrates and the second series of semiconductor substrates was subjected to a second plasma etch method employing a chlorine, boron trichloride, trifluoromethane and argon etchant gas composition in accord with the preferred embodiments of the present invention. The second plasma etch method also employed: (1) a reactor chamber pressure of about 12 mtorr; (2) a source radio frequency power of about 1200 watts at a radio frequency of 27.2 MHZ; (3) a bias sputtering power of about 150 watts; (4) a substrate temperature of about 50 degrees centigrade; (5) a chlorine flow rate of about 60 standard cubic centimeters per minute (sccm); (6) a boron trichloride flow rate of about 70 standard cubic centimeters per minute (sccm); (7) a tritluoromethane flow rate of 5 standard cubic centimeters per minute (sccm); and (8) an argon sputtering gas flow rate of about 40 standard cubic centimeters per minute (sccm).

Etch rates were determined for the four permutations derived from etching the blanket photoresist layers or the blanket silsesquioxane spin-on-glass (SOG) material derived layers within either the first plasma or the second plasma. Results indicated: (1) a first etch rate ratio of about 0.5:1 for the blanket photoresist layer with respect to the blanket silsesquioxane spin-on-glass (SOG) material derived layer within the first plasma employing the fluorine containing etchant gas composition; and (2) a second etch rate ratio of about 2:1 for the blanket photoresist layer with respect to the blanket silsesquioxane spin-on-glass (SOG) material derived layer within the second plasma employing the chlorine containing etchant gas composition.

Assuming, in accord with the preferred embodiments of the present invention, a maximum thickness of a patterned photoresist layer of about 8000 angstroms and a patterned hard mask layer thickness of about 2000 angstroms, the foregoing etch rate ratios yield a patterned photoresist layer and patterned hard mask layer composite which acts effectively as a patterned photoresist layer formed to an original thickness of about 10000 angstroms. Such an effective thickness of a patterned photoresist is typically sufficient to pattern with uniform and attenuated linewidth in the range of about 0.25 to about 0.5 microns a blanket chlorine containing plasma etchable layer of thickness from about 5000 to about 9000 angstroms.

As is understood by a person skilled in the art, the preferred embodiments and examples of the present invention are illustrative of the present invention rather than limiting of the present invention. Revisions and modifications may be made to methods, materials, structures and dimensions through which is formed a microelectronics fabrication in accord with the preferred embodiments of the present invention, while still forming a microelectronics fabrication in accord with the present invention, as defined by the appended claims.

What is claimed is:

1. A method for forming a chlorine containing plasma etched patterned layer comprising:

providing a substrate employed within a microelectronics fabrication;

forming over the substrate a blanket target layer formed of a material susceptible to etching within a second plasma employing a chlorine containing etchant gas composition;

forming upon the blanket target a blanket hard mask layer formed employing a silsesquioxane spin-on-glass (SOG) material;

forming upon the blanket hard mask layer a patterned photoresist layer;

etching while employing the patterned photoresist layer as a first etch mask layer and while employing a first plasma employing a fluorine containing etchant gas composition the blanket hard mask layer to form a patterned hard mask layer; and etching while employing at least the patterned hard mask layer as a second etch mask layer and while employing the second plasma employing the chlorine containing etchant gas composition the blanket target layer to form a patterned target layer.

2. The method of claim 1 wherein:

the second plasma etch method also employs a reducing material; and the patterned hard mask layer is reduction resistant within the second plasma in comparison with a patterned hard mask layer formed of silicon dioxide.

3. The method of claim 1 wherein the microelectronics fabrication is selected from the group consisting of integrated circuit microelectronics fabrications, solar cell microelectronics fabrications, ceramic substrate microelectronics fabrications and flat panel display microelectronics fabrications.

4. The method of claim 1 wherein the blanket target layer is formed from a chlorine containing plasma etchable material selected from the group consisting of metals, metal alloys, metal silicides, polysilicon and polycides (polysilicon/metal silicide stacks).

5. The method of claim 1 wherein the silsesquioxane spin-on-glass (SOG) material is selected from the group consisting of trialkoxysilanes, methyltrialkoxysilanes and trifluoromethyltrialkoxysilanes.

6. The method of claim 1 wherein the blanket hard mask layer is formed to a thickness of from about 2000 to about 4000 angstroms.

7. A method for forming a chlorine containing plasma etched patterned layer comprising:

providing a substrate employed within a microelectronics fabrication;

forming over the substrate a blanket target layer formed of a material susceptible to etching within a second plasma employing a chlorine containing etchant gas composition;

forming upon the blanket target a blanket hard mask layer formed employing an amorphous carbon material;

forming upon the blanket hard mask layer a patterned photoresist layer;

etching while employing the patterned photoresist layer as a first etch mask layer and while employing a first plasma employing a fluorine containing etchant gas composition the blanket hard mask layer to form a patterned hard mask layer; and etching while employing at least the patterned hard mask layer as a second etch mask layer and while employing the second plasma employing the chlorine containing etchant gas composition the blanket target layer to form a patterned target layer.

8. The method of claim 7 further comprising stripping from the substrate the patterned photoresist layer and the patterned hard mask layer employing an oxygen containing plasma stripping method.

9. The method of claim 7 wherein the microelectronics fabrication is selected from the group consisting of integrated circuit microelectronics fabrications, solar cell microelectronics fabrications, ceramic substrate microelectronics fabrications and flat panel display microelectronics fabrications.

10. The method of claim 7 wherein the blanket target layer is formed from a chlorine containing plasma etchable material selected from the group consisting of metals, metal alloys, metal salacities, polysilicon and polycides (polysilicon/metal silicide stacks).

11. The method of claim 7 wherein the amorphous carbon material is selected from the group consisting of amorphous carbon and fluorinated amorphous carbon.

12. The method of claim 7 wherein the blanket hard mask layer is formed to a thickness of from about 2000 to about 4000 angstroms.

* * * * *